United States Patent
Park et al.

(10) Patent No.: US 8,731,111 B2
(45) Date of Patent: May 20, 2014

(54) APPARATUS AND METHOD FOR TUNABLE WIDEBAND SOLAR RADIO NOISE MEASUREMENT

(75) Inventors: Jae Woo Park, Daejeon (KR); Cheol Oh Jeong, Gyeonggi-do (KR); Jae Hoon Kim, Daejeon (KR); Jung Hoon Kim, Seoul (KR)

(73) Assignee: Electronics and Telecommunications Research Institute, Daejeon (KR)

(*) Notice: Subject to any disclaimer, the term of this patent is extended or adjusted under 35 U.S.C. 154(b) by 209 days.

(21) Appl. No.: 13/313,036

(22) Filed: Dec. 7, 2011

(65) Prior Publication Data

US 2012/0163440 A1 Jun. 28, 2012

(30) Foreign Application Priority Data

Dec. 23, 2010 (KR) .................. 10-2010-0134042

(51) Int. Cl.
*H04L 27/00* (2006.01)

(52) U.S. Cl.
USPC ......... 375/316; 375/377; 455/131; 455/150.1

(58) Field of Classification Search
USPC .......... 375/316, 340, 344, 345, 377; 455/130, 455/131, 150.1, 151.2, 154.1, 160.1, 161.1, 455/164.1, 173.1, 182.1, 183.1, 188.1, 455/193.1
See application file for complete search history.

(56) References Cited

U.S. PATENT DOCUMENTS

| 7,209,760 | B2 | 4/2007 | Kochanski et al. | |
|---|---|---|---|---|
| 2010/0166122 | A1* | 7/2010 | Pahuja et al. | 375/344 |
| 2011/0069787 | A1* | 3/2011 | Lee et al. | 375/322 |
| 2011/0142178 | A1* | 6/2011 | Huang et al. | 375/340 |
| 2012/0032847 | A1* | 2/2012 | Baktur | 342/365 |
| 2012/0238228 | A1* | 9/2012 | Zhang et al. | 455/160.1 |

* cited by examiner

*Primary Examiner* — Dac Ha
(74) *Attorney, Agent, or Firm* — Rabin & Berdo, P.C.

(57) ABSTRACT

An apparatus and method for tunable wideband solar radio noise measurement is provided. Accordingly, it is possible to directly measure the absolute flux of solar radio waves in a desired frequency band using a tunable receiver, and accordingly, to protect radio communication broadcasting systems located on the earth from its damage caused due to radio burst, noise and the like.

9 Claims, 3 Drawing Sheets

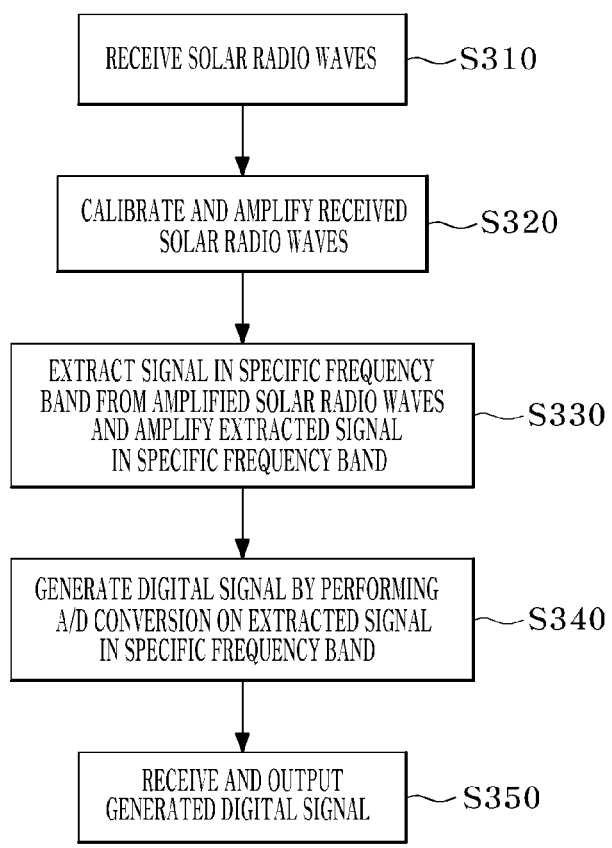

APPARATUS AND METHOD FOR TUNABLE WIDEBAND SOLAR RADIO NOISE MEASUREMENT

CROSS-REFERENCES TO RELATED APPLICATIONS

The present application claims priority under 35 U.S.C. 119(a) to Korean Application No. 10-2010-0134042, filed on Dec. 23, 2010, in the Korean Intellectual Property Office, which is incorporated herein by reference in its entirety set forth in full.

BACKGROUND

Exemplary embodiments of the present invention relate to an apparatus and method for tunable wideband solar radio noise measurement, and more particularly, to an apparatus and method for tunable wideband solar radio noise measurement, which enables the absolute flux of solar radio waves to be directly measured in a desired frequency band using a tunable receiver.

The sun usually generates radio waves in all frequency bands, and the generated radio waves are propagated to the earth. In most cases, the solar radio waves have no influence on radio communication broadcasting systems on the earth or in the universe.

However, when a solar flare occurs, very intense radio waves of a specific wavelength are generated from the sun, and therefore may cause serious damage to radio communication infrastructures.

The method for measuring solar radio waves is generally divided into two types.

That is, the two types are an RSTN type and an SRBL type. In the RSTN type, the number of receivers that are required are the number of observed frequencies so as to measure an absolute frequency. In the SRBL type, the intensity of a desired radio wave is measured by obtaining an absolute value of observed frequencies at one or two places and then performing relative calibration.

In these methods, measurement is possible at only some of all the specific fixed frequencies, and the absolute flux of solar radio waves is estimated at a desired frequency except the specific fixed frequencies, using interpolation. However, as it is known that values extracted using the interpolation are considerably different actual values, the interpolation cannot be used any more. Accordingly, it is required to directly measure the absolute flux of solar radio waves in a desired frequency band.

SUMMARY

An embodiment of the present invention relates to an apparatus and method for tunable wideband solar radio noise measurement, which enables the absolute flux of solar radio waves to be directly measured in a desired frequency band using a tunable receiver.

In one embodiment, an apparatus for tunable wideband solar radio noise measurement includes an antenna configured to receive solar radio waves; a front-end controller configured to calibrate and amplify the received solar radio waves; a tuner configured to extract a signal in a specific frequency band by tuning the amplified solar radio waves in the specific frequency band, and amplify the extracted signal in the specific frequency band; an A/D converter configured to generate a digital signal by performing A/D conversion on the extracted signal in the specific frequency band; a computer configured to receive the generated digital signal and transmit information in the specific frequency band to the tuner; a back-end controller configured to perform interface between the tuner and the computer; and an equipment controller configured to control the antenna and the front-end controller.

The tuner may include a tunable frequency synthesizer configured to receive the signal in the specific frequency band from the computer; a signal processor configured to extract the signal in the specific frequency band in the tunable frequency synthesizer from the solar radio waves amplified by the front-end controller; a filter configured to filter the signal outputted from the signal processor; an amplifier configured to amplified the filtered signal; and a frequency selector configured to output the signal in the specific frequency band.

The computer may transmit the information in the specific frequency band, selected so as to correspond to a user's input signal, to the tuner.

The computer may transmit the information in the specific frequency band, selected according to corresponding to a selection scheme previously programmed and stored, to the tuner The tuner may extract the signal in the specific frequency band from the amplified solar radio waves by tuning the amplified solar radio waves so as to correspond to the information in the specific frequency band, of which instructions received from the computer.

In another embodiment, a method for tunable wideband solar radio noise measurement includes receiving solar radio waves; calibrating and amplifying the received solar radio waves; extracting a signal in a specific frequency band by tuning the amplified solar radio waves to the signal in the specific frequency band, and amplifying the extracted signal in the specific frequency band; generating a digital signal by performing A/D conversion on the extracted signal in the specific frequency band; and receiving and outputting the generated digital signal.

The extracting and amplifying of the signal may include receiving a signal in a specific frequency band, which is an object to be selected; extracting the signal in the specific frequency band from the amplified solar radio waves; and filtering the extracted signal and amplifying the filtered signal.

In the step of receiving of the signal in the specific frequency band, the signal in the specific frequency band, selected according to a user's input signal, may be received.

In the step of receiving of the signal in the specific frequency band, the signal in the specific frequency band, selected according to a selection scheme previously programmed and stored, may be received.

BRIEF DESCRIPTION OF THE DRAWINGS

The above and other aspects, features and other advantages will be more clearly understood from the following detailed description taken in conjunction with the accompanying drawings, in which:

FIG. 3 is a flowchart illustrating a method for tunable wideband solar radio noise measurement according to an embodiment of the present invention.

DESCRIPTION OF SPECIFIC EMBODIMENTS

Hereinafter, embodiments of the present invention will be described with reference to accompanying drawings. How- FIG. 1 is a system configuration diagram of an apparatus for tunable wideband solar radio noise measurement according to an embodiment of the present invention.

Figure 1:
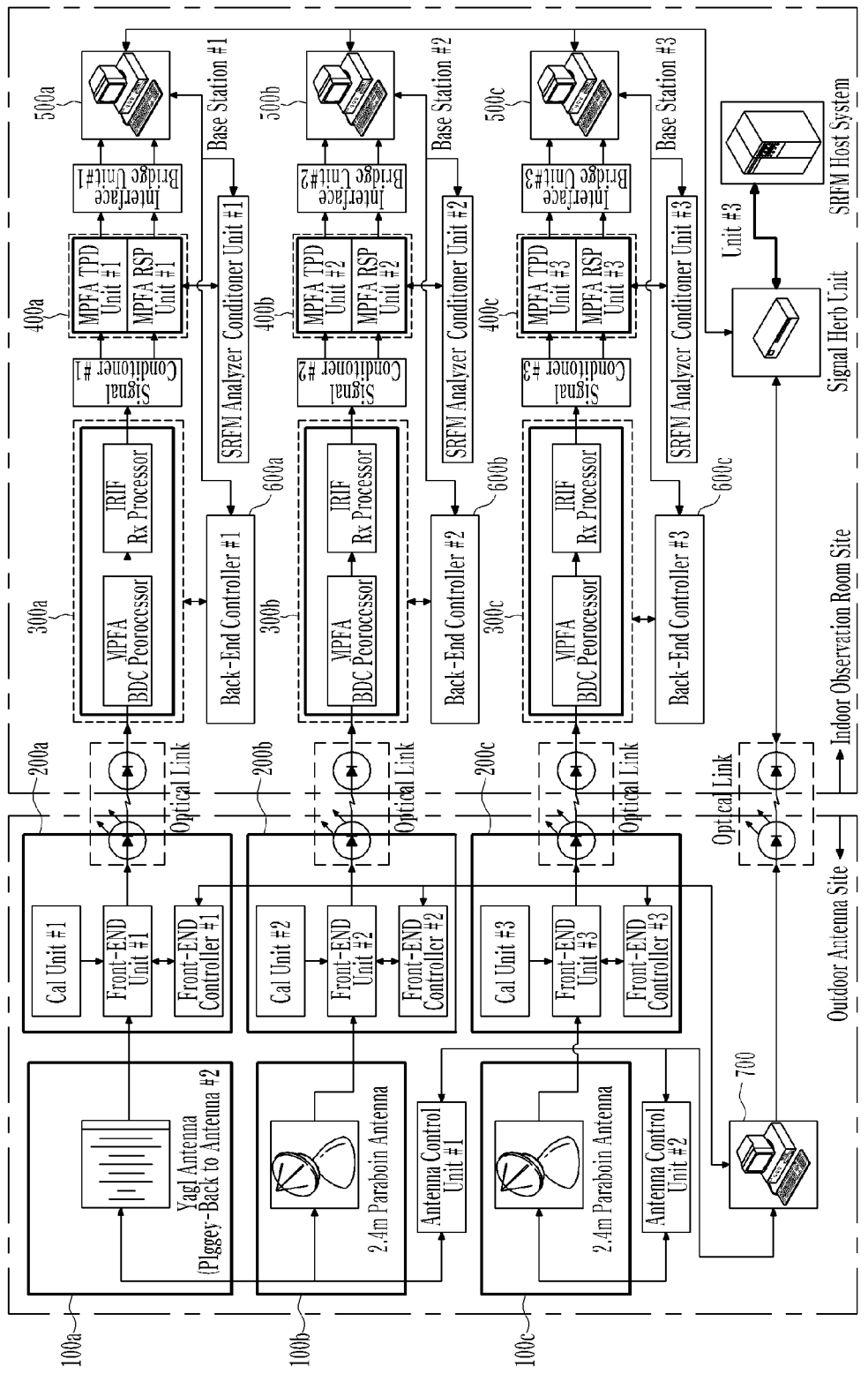
FIG. 1 is a system configuration diagram of an apparatus for tunable wideband solar radio noise measurement according to an embodiment of the present invention.

Referring to FIG. 1, the apparatus according to this embodiment includes an antenna 100, a front-end controller 200, a tuner 300, an A/D converter 400, a computer 500, a back-end controller 600 and an equipment controller 700.

Each of the components may be composed of a plurality of components. In this case, the plurality of components are discriminated using identification signs a, b and c. For example, an antenna 100a is a Yagi antenna and receives electric waves in a frequency band of 0.5 to 1 GHz. An antenna 100b is a 2.4 m parabola antenna and receives electric waves in a frequency band of 1 to 8 GHz. An antenna 100c is a 2.4 m parabola antenna and receives electric waves in a frequency band of 8 to 18 GHz. Here, it has been described that the antenna 100 composed of three antennas. However, the number of antennas may be modified within the scope of the present invention.

The antenna 100 receives/observes solar radio waves. The front-end controller 200 calibrates and amplifies the observed solar radio waves.

The tuner 300 receives a signal received from the front-end controller 200 and tunes the received signal to a signal in a selected frequency band to be observed, thereby extracting and amplifying the tuned signal. The A/D converter 400 performs A/D conversion on the signal of the selected frequency band, received from the tuner 300.

The computer 500 stores and analyzed the received data and derives the absolute flux of solar radio noises. The computer 500 selects a frequency band of solar radio waves to be observed, and transfers the selected frequency band to the tuner 300 through the back-end controller 600.

The back-end controller 600 performs interface between the tuner 300 and the computer 500. The equipment controller 700 controls the antenna 100 and the front-end controller 200.

Here, the back-end controller 600 may have a function of selecting a frequency to be observed through the computer 500 at any time using a manual selection scheme so as to correspond to an input signal manually inputted by a user or a function of periodically selecting a frequency to be observed through the computer 500 by software previously defined using a program.

The tuner 300 may perform a function of tuning the received signal to a signal in a frequency band selected through the computer 500, searching for only a signal in the selected frequency band and then transferring the searched signal to the next component.

Figure 2:
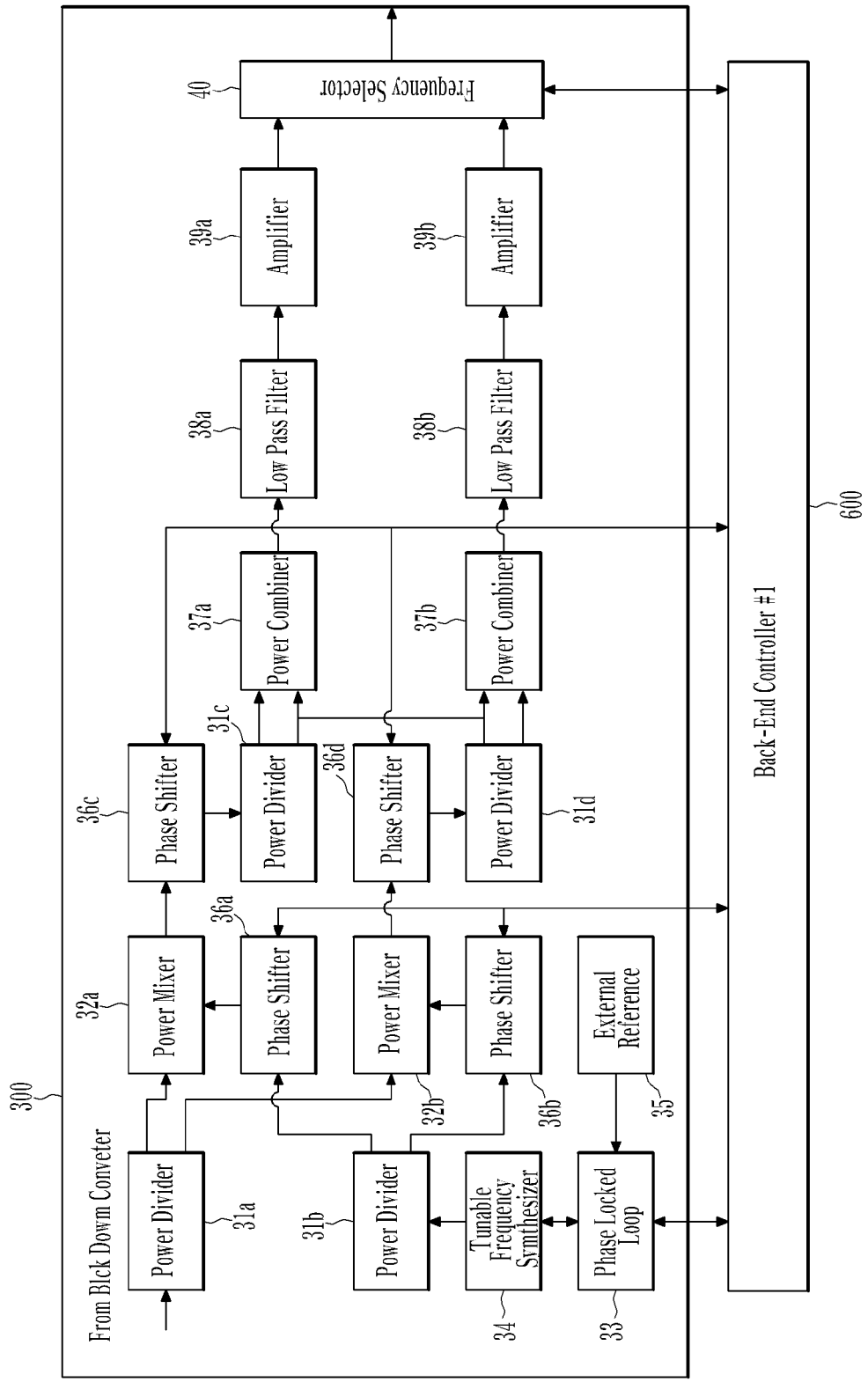
FIG. 2 is a block configuration diagram of a tuner in the apparatus according to the embodiment of the present invention.

FIG. 2 is a block configuration diagram of the tuner in the apparatus according to the embodiment of the present invention.

Referring to FIG. 2, the tuner 300 includes a power divider 31, a power mixer 32, a phase locked loop 33, a tunable frequency synthesizer 34, an external reference 35, a phase shifter 36, a power combiner 37, a low pass filter 38, an amplifier 39 and a frequency selector 40.

Here, the power divider 31, the power mixer 32, the phase shifter 36 and the power combiner 37 may be specified as a signal processor. As described above, each of the components may be composed of a plurality of components. In this case, the plurality of components are discriminated using identification signs a, b and c.

In this embodiment, the tuner 300 is configured so that an arbitrary frequency can be selected and observed depending on a user's object. Generally, the selection of a tunable frequency may be performed using an FM tuner or the like. The FM tuner has a structure of obtaining a resonance frequency by changing an element value of a resistance, inductance or capacitance component, and accordingly, extracting an arbitrary frequency component.

However, such a manner does not have accuracy to a degree, used in observation of the celestial body including solar radio waves, and observation in a wide range of a few GHz is difficult in such a manner. Further, image signal removal efficiency is not high, and therefore, an observation band may be contaminated by aliasing noise. A tunable frequency selection procedure in the tuner 300 is as follows.

As illustrated in FIG. 2, the tunable frequency selection procedure in the tuner 300 employs an algorithm of selecting an arbitrary frequency by performing quadrature signal mixing on a given signal using the tunable frequency synthesizer 34 and the phase shifter 36.

First, an RF signal passing through the front-end controller 200, e.g., a block down converter, is mixed with a signal shifted by a predetermined phase in the tunable frequency synthesizer 34. The frequency of the mixed intermediate frequency signal (IF) is shifted in synchronization with a frequency to be selected. The two signals are individually divided and then synthesized. Through such a process, two signals are finally generated, and a signal suitable for a frequency selected by a user is finally selected from the generated signals through a filtering and gain correction process.

All the processes described above are controlled by a processor of the back-end controller 600, and control and monitoring of signals is performed through communication with a main processor of a system. The signal obtained as such a result is again applied to signal analysis equipment, and signal processing is performed on the signal in the signal analysis equipment. Then, secondary frequency correction is performed on the signal-processed signal through digital down conversion and filtering, thereby performing final observation.

In the tuner 300, primary frequency selection is performed in the RF tuner as illustrated in FIG. 2, and secondary frequency selection and correction is performed using a digital tuning scheme in the signal analysis equipment, thereby performing tunable frequency observation in a user setup scheme with respect to wideband signals of a few GHz.

FIG. 3 is a flowchart illustrating a method for tunable wideband solar radio noise measurement according to an embodiment of the present invention.

First, the apparatus receives solar radio waves (S310), and calibrates and amplifies the received solar radio waves (S320). Then, the apparatus extracts a signal in a specific frequency band from the amplified solar radio waves and amplifies the extracted signal (S330).

In order to extract and amplify the signal, the apparatus receives the signal in the specific frequency band, which is an object to be selected, and extracts the received signal in the specific frequency band from the amplified solar radio waves. Then, the apparatus filters the extracted signal and amplifies the filtered signal, thereby outputting the amplified signal.

In a case where the signal in the specific frequency band is received, the apparatus may receive the signal in the specific frequency band selected so as to correspond to an input signal manually inputted by a user or receive the signal in the specific frequency band selected so as to correspond to a selection scheme previously programmed and stored.

The apparatus generates a digital signal by performing A/D conversion on the extracted signal in the specific frequency band (S340), and outputs the generated digital signal (S350).

As described above, according to the present invention, it is possible to measure a noise signal propagated from the sun in a desired frequency band using an antenna and a tunable receive, to convert the measured noise signal into an absolute flux, and to display the converted absolute flux for each frequency band.

Further, it is possible to directly measure the absolute flux of solar radio waves in a desired frequency band using a tunable receiver, and accordingly, to protect radio communication broadcasting systems located on the earth from its damage caused due to radio burst, noise and the like.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An apparatus for tunable wideband solar radio noise measurement, the apparatus comprising:
    an antenna configured to receive solar radio waves;
    a front-end controller configured to calibrate and amplify the received solar radio waves;
    a tuner configured to extract a signal in a specific frequency band by tuning the amplified solar radio waves to the signal in the specific frequency band, and amplify the extracted signal in the specific frequency band;
    an A/D converter configured to generate a digital signal by performing A/D conversion on the extracted signal in the specific frequency band;
    a computer configured to receive the generated digital signal and transmit information in the specific frequency band to the tuner;
    a back-end controller configured to perform interface between the tuner and the computer; and
    an equipment controller configured to control the antenna and the front-end controller,
    wherein the digital signal represents a value of the solar radio noise measurement.

2. The apparatus of claim 1, wherein the tuner comprises:
    a tunable frequency synthesizer configured to receive the signal in the specific frequency band from the computer;
    a signal processor configured to extract the signal in the specific frequency band in the tunable frequency synthesizer from the solar radio waves amplified by the front-end controller;
    a filter configured to filter the signal outputted from the signal processor;
    an amplifier configured to amplified the filtered signal; and
    a frequency selector configured to output the signal in the specific frequency band.

3. The apparatus of claim 1, wherein the computer transmits the information in the specific frequency band, selected according to a user's input signal, to the tuner.

4. The apparatus of claim 1, wherein the computer transmits the information in the specific frequency band, selected so as to corresponding to a selection scheme previously programmed and stored, to the tuner.

5. The apparatus of claim 1, wherein the tuner extracts the signal in the specific frequency band from the amplified solar radio waves by tuning the amplified solar radio waves so as to correspond to the information in the specific frequency band, received from the computer.

6. A method for tunable wideband solar radio noise measurement, the method comprising:
    receiving solar radio waves;
    calibrating and amplifying the received solar radio waves;
    extracting a signal in a specific frequency band by tuning the amplified solar radio waves to the signal in the specific frequency band, and amplifying the extracted signal in the specific frequency band;
    generating a digital signal by performing A/D conversion on the extracted signal in the specific frequency band; and
    receiving and outputting the generated digital signal,
    wherein the digital signal represents a value of the solar radio noise measurement.

7. The method of claim 6, wherein the step of extracting and amplifying of the signal comprises:
    receiving a signal in a specific frequency band, which is an object to be selected;
    extracting the signal in the specific frequency band from the amplified solar radio waves; and
    filtering the extracted signal and amplifying the filtered signal.

8. The method of claim 7, wherein in the step of receiving of the signal in the specific frequency band, the signal in the specific frequency band, selected according to a user's input signal, is received.

9. The method of claim 7, wherein in the step of receiving of the signal in the specific frequency band, the signal in the specific frequency band, selected according to a selection scheme previously programmed and stored, is received.

* * * * *